(12) United States Patent
Anderson et al.

(10) Patent No.: US 7,701,058 B2
(45) Date of Patent: Apr. 20, 2010

(54) UNDOPED POLYSILICON METAL SILICIDE WIRING

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 525 days.

(21) Appl. No.: 11/627,795

(22) Filed: Jan. 26, 2007

(65) Prior Publication Data

US 2008/0179749 A1     Jul. 31, 2008

(51) Int. Cl.
*H01L 23/48* (2006.01)

(52) U.S. Cl. .................. 257/756; 257/754; 257/755; 257/E23.01; 438/647; 438/657

(58) Field of Classification Search ................. 257/756, 257/E23.01, 754, 755, 757; 438/647, 657
See application file for complete search history.

(56) References Cited

U.S. PATENT DOCUMENTS 5,480,837 A * 1/1996 Liaw et al. .................. 438/626

2006/0211187 A1    9/2006 Choi et al.

FOREIGN PATENT DOCUMENTS

| | | |
|---|---|---|
| JP | 11-145145 | 5/1999 |
| JP | 2003-8012 | 1/2003 |
| JP | 2005-340350 | 12/2005 |
| JP | 2006-19397 | 1/2006 |
| JP | 2006-49576 | 2/2006 |

* cited by examiner

*Primary Examiner*—Thinh T Nguyen
(74) *Attorney, Agent, or Firm*—Scully, Scott, Murphy & Presser, P.C.; Anthony J. Canale, Esq.

(57) ABSTRACT

Defect density of a polysilicon metal silicide wiring is reduced by employing a block of undoped polysilicon metal silicide in locations in which dopants are not needed in the underlying polysilicon. Furthermore, detection of presence of defects in the polysilicon metal wiring that adversely impacts device performance at high frequency is facilitated by employing a block of undoped polysilicon metal silicide since defects in undoped polysilicon metal silicide is more readily detectable than defects in doped polysilicon metal silicide. Locations wherein undoped polysilicon metal silicide wiring is employed include areas over shallow trench isolation.

18 Claims, 2 Drawing Sheets

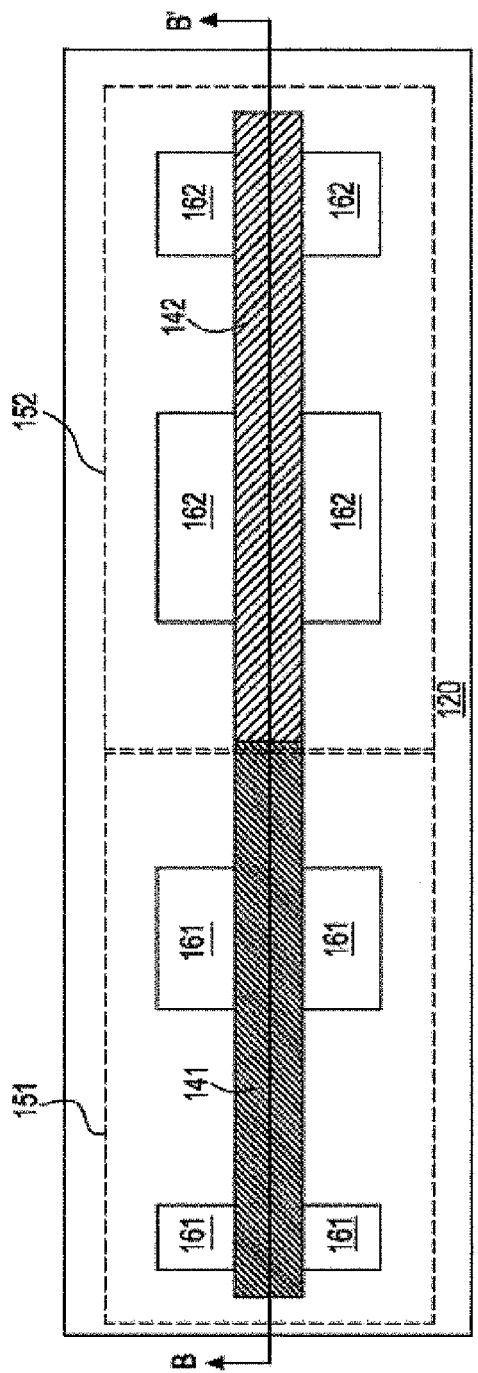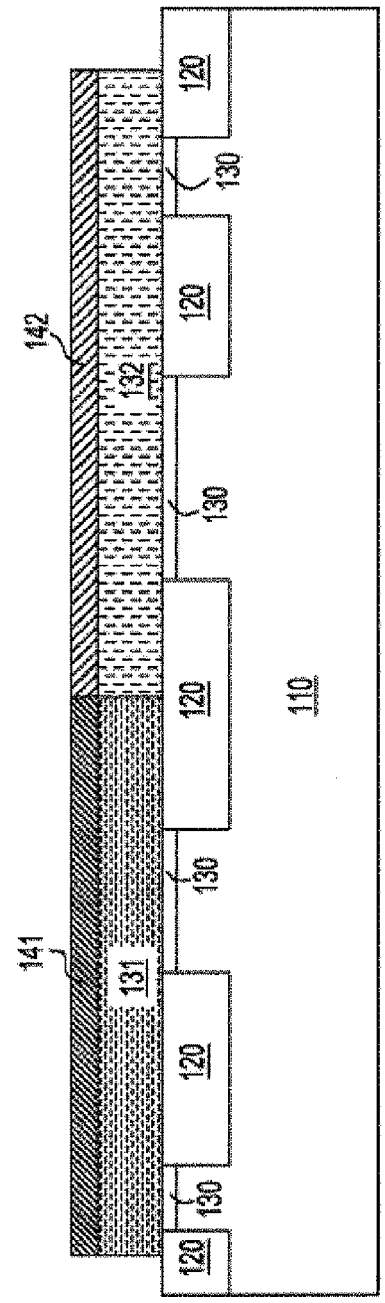
FIG. 1A (Prior Art)
FIG. 1B (Prior Art)

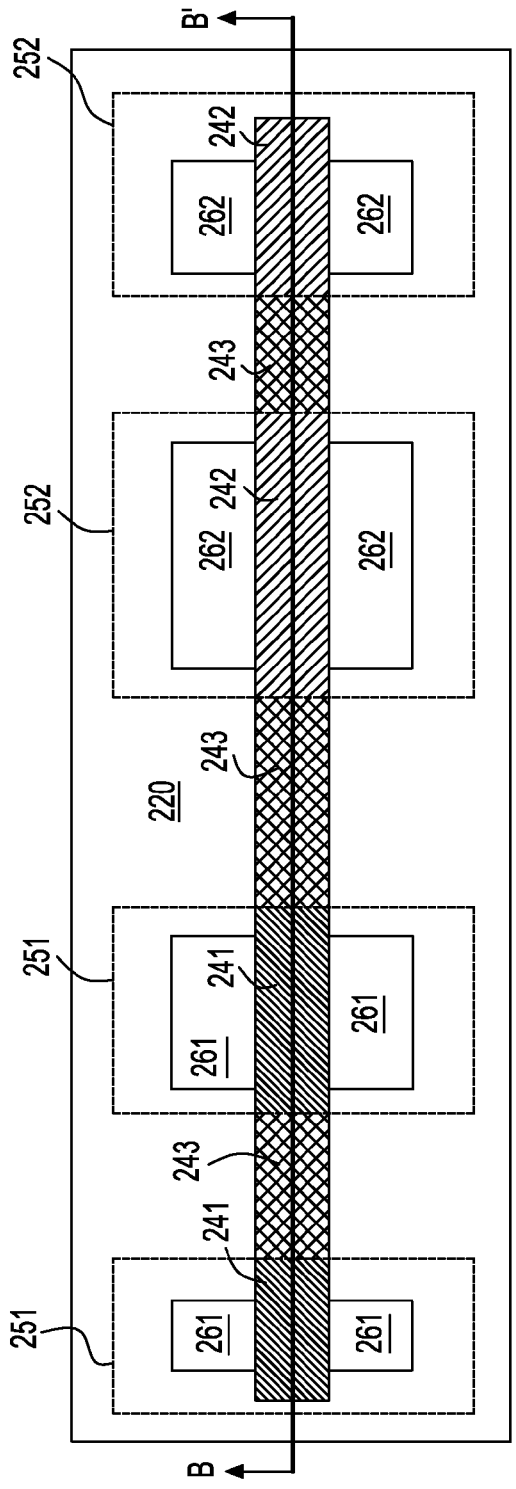
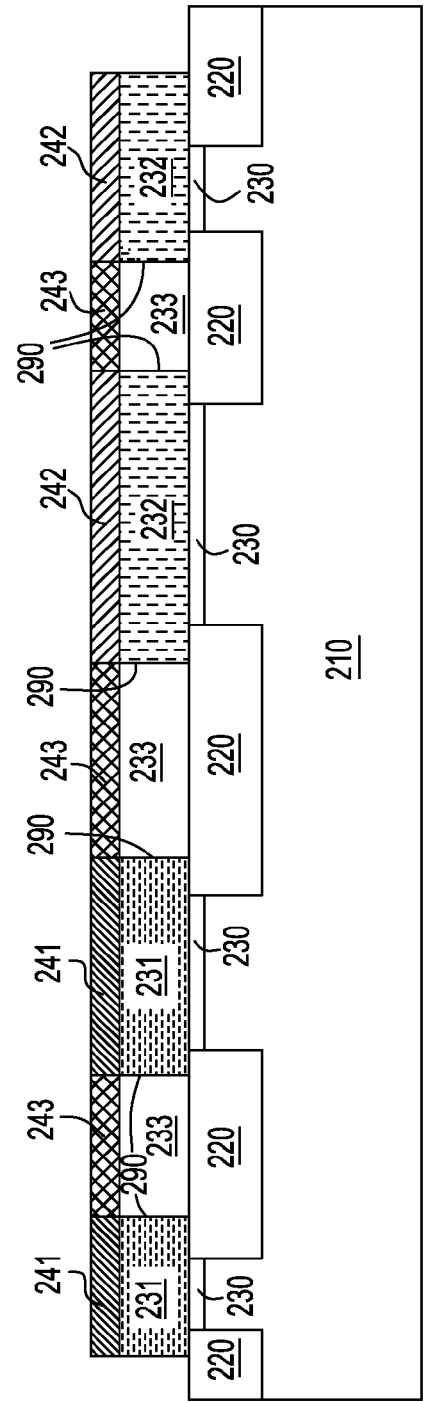
FIG. 2A
FIG. 2B

UNDOPED POLYSILICON METAL SILICIDE WIRING

FIELD OF THE INVENTION

The present invention relates to a semiconductor structure, and particularly to a metal silicide structure used in electrical wiring of semiconductor devices.

BACKGROUND OF THE INVENTION

Metal silicides formed on polysilicon, or "polysilicon metal silicides" are widely used in semiconductor industry for their conductivity, which is higher than the conductivity of a doped polysilicon. The conductivity of a polysilicon metal silicide is about two orders of magnitude greater than the conductivity of even the most heavily doped polysilicon, thus polysilicon metal silicides provide a relatively low resistance wiring. A polysilicon metal silicide with a thickness of about 25 nm has a sheet resistance on the order of 10 Ohms per square.

A most typical application of polysilicon metal silicides is a gate metal silicide. A MOSFET comprises a gate which contains a gate dielectric and a gate conductor. After the formation of the gate dielectric, a polysilicon layer is deposited and patterned to define the gate. After formation of gate spacers, a metal layer is deposited over and reacted with the underlying polysilicon layer. Polysilicon in an upper portion of the polysilicon layer reacts with the metal layer and forms a gate metal silicide, which is a polysilicon metal silicide.

Utilizing the conductive property of polysilicon metal silicides, polysilicon metal silicide wiring is extensively used in semiconductor applications to provide an electrical connection between adjacent semiconductor devices on a gate conductor level, or as commonly referred to, on a "polysilicon conductor" (PC) level. The gate of a MOSFET, which comprises a stack of a polysilicon layer and a gate metal silicide layer, is extended over shallow trench isolation that surrounds the MOSFET and is connected to a portion of another device, such as the gate of another MOSFET. For example, a CMOS inverter has a p-type field effect transistor (PFET) and an n-type field effect transistor (NFET) in a series connection such that the drains of the PFET and NFET are electrically connected and the gates of the PFET and the NFET are electrically connected. Polysilicon metal wiring is used in this case to connect the gate of the PFET and the gate of the NFET. Such wiring on a PC level may be practiced on any adjacent MOSFET devices or even on bipolar devices provided that suitable polysilicon metal silicides are present.

Polysilicon metal silicide wiring according to the prior art utilizes P+ doped polysilicon or N+ doped polysilicon to form polysilicon metal silicides. Due to the presence of dopants in the polysilicon, the silicides tend to be more prone to defects in the subsequently formed polysilicon metal silicides compared to polysilicon metal silicides formed from an undoped polysilicon.

Referring to FIGS. 1A and 1B, an exemplary polysilicon metal silicide wiring structure according to the prior art is shown. FIG. 1A is a top-down view and FIG. 1B is a vertical cross-sectional view of along the plane B-B' in FIG. 1A. Two p-type MOSFETs and two n-type MOSFETs are shown on a semiconductor substrate 110. Each of the two p-type MOSFETs comprises P+ doped source and drain regions 161, a gate dielectric 130, a block of P+ doped polysilicon 131 and a block of P+ doped polysilicon metal silicide 141. Each of the two n-type MOSFETs comprises N+ doped source and drain regions 162, a gate dielectric 130, a block of N+ doped polysilicon 132, and a block of N+ doped polysilicon metal silicide 142. The block of P+ doped polysilicon 131, the block of P+ doped polysilicon metal silicide 141, the block of N+ doped polysilicon 132, and the block of N+ doped polysilicon metal silicide 142 collectively form a gate line. Connections between adjacent MOSFETs are formed by extensions of the gate conductor that may be a stack of the Block of P+ doped polysilicon 131 and the block of P+ doped polysilicon metal silicide 141, a stack of the block of N+ doped polysilicon 132 and the block of N+ doped polysilicon metal silicide 142, or a combination thereof.

To form the Block of P+ doped polysilicon 131 and the block of N+ doped polysilicon 132, an undoped polysilicon layer may be deposited over the gate dielectric layer 130 and over a shallow trench isolation 120, lithographically patterned, and etched. Implantation of p-type dopants with a first mask and implantation of n-type dopants with a second mask follow. The first mask allows the p-type dopants into a "p-type implant area" 151 that includes the STI area that surrounds the PFETs, while blocking the p-type dopants outside the p-type implant area 151. The second mask allows the n-type dopants into an "n-type implant area" 152 that includes the STI area that surrounds the NFETs, while blocking the n-type dopants outside the n-type implant area 152.

Neighboring active areas containing the same type of MOSFET belong to the same p-type implant area. Therefore, an STI area located between two neighboring PFETs or two neighboring NFETs belongs to the same implant area as the two neighboring MOSFETs. Most often, an edge of the p-type implant area 151 contacts an edge of the n-type implant area 152 within an overlay tolerance of lithography used to define the two implant areas (151, 152). An STI area located between a PFET and a neighboring NFET is split into two portions, in which a first portion belongs to a p-type implant area 151 and a second portion belongs to an n-type implant area 152 and the two implant areas adjoin each other. If one of the species of the dopants have a faster diffusion rate within polysilicon, the boundary between the block of P+ doped polysilicon 131 and the block of N+ doped polysilicon 132 may move into the polysilicon region with slower dopant diffusion speed. This is exemplified in FIG. 1A for a case wherein the p-type dopants have a higher diffusion rate than the n-type dopants. Alternately, a heavily doped polysilicon layer, instead of an undoped polysilicon layer, may be deposited over the gate dielectric layer and patterned followed by an implantation of the dopants of the opposite type in sufficient quantity to reverse the doping type on a portion of the heavily doped polysilicon layer. Both methods produce two types of heavily doped polysilicon layers that adjoin each other in some locations.

Typically, spacers (not shown) are formed around the heavily doped polysilicon layers. A metal layer comprising a silicide forming metal, for example cobalt, tantalum, titanium, nickel, other refractory metal or an alloy thereof, is subsequently deposited and reacted to form silicides. The reacted metal layer forms a metal silicide (not shown) on the P+ doped or N+ doped source and drain regions (161, 162). The reacted metal layer also forms a block of P+ doped polysilicon metal silicide 141 on top of the block of P+ doped polysilicon 131 and a block of N+ doped polysilicon metal silicide 142 on top of the block of N+ doped polysilicon 132. The properties of the P+ doped polysilicon metal silicide and the properties of the N+ doped polysilicon metal silicide are different from the properties of an undoped polysilicon metal silicide, that is, a metal silicide material by reacting a metal with an undoped polysilicon, in that the presence of the p-type or n-type dopants in high concentration (on the order of about 1 atomic percent) impedes the silicidation process, making the resulting doped polysilicon metal silicide more prone to defects than an undoped polysilicon metal silicide.

The exemplary polysilicon metal silicide wiring structure according to the prior art in FIGS. 1A and 1B comprises a block of P+ doped polysilicon, a block of N+ doped polysilicon adjoining the P+ polysilicon, a block of P+ doped polysilicon metal silicide adjoining the block of P+ doped polysilicon, and a block of N+ doped polysilicon metal silicide adjoining the block of N+ doped polysilicon and adjoining the block of P+ doped polysilicon metal silicide.

While the resistivity of a metal silicide is typically about two orders of magnitude lower than the resistivity of a heavily doped polysilicon, the resistance per unit width and length of gate wiring of P+ doped polysilicon or N+ doped polysilicon is only about one order of magnitude higher than the resistance per unit width and length of gate wiring of a polysilicon metal silicide since the thickness of a typical doped polysilicon layer is about one order of magnitude greater than the thickness of a typical polysilicon metal silicide.

According to the prior art, a defect such as a break in a polysilicon metal silicide wiring, is not easily detectable since the loss in conductance of the wiring due to the defect in the polysilicon metal silicide is partly compensated for by the P+ doped polysilicon or N+ doped polysilicon that provides a parallel electrical conduction path to the defect in the polysilicon metal silicide. The overall increase in the resistance of the wiring may not be significant and therefore, may not be easily detectable in a low-speed test, in which DC condition must lead to a detectable product failure, i.e., product test conditions that apply virtually constant voltage or current signals, are performed. However, MOSFET devices typically operate at a high frequency, e.g., at a frequency over 1 GHz, and the functionality of the MOSFET devices rapidly deteriorate due to presence of such defects in the polysilicon metal silicide wiring. In other words, while the defects in the polysilicon metal silicide wiring is not easily detectable in a low-speed test, the same defects in the polysilicon metal wiring cause significant circuit degradation in the circuit performance.

Testing of the individual MOSFET devices for circuit performance to guard against the possibility of circuit degradation due to defects in the polysilicon metal wiring requires a high-speed functional tester, in which AC measurements, i.e., measurements that apply high frequency signals, are performed. High-speed functional testing tends to be costly and time-consuming.

Therefore, there exists a need for a semiconductor structure that reduces the defect density in a polysilicon metal silicide wiring.

Furthermore, there exists a need for a semiconductor structure that allows a less costly detection of presence of defects in a polysilicon metal silicide wiring, and preferably in a low-speed testing.

SUMMARY OF THE INVENTION

The present invention addresses the needs described above by providing a polysilicon metal silicide wiring structure comprising a block of undoped polysilicon and a block of metal silicide formed from the block of undoped polysilicon, that is, a block of "undoped polysilicon metal silicide."

Specifically, the present invention provides a polysilicon metal silicide wiring structure in which a block of undoped polysilicon adjoins a block of doped polysilicon and a block of undoped polysilicon metal silicide adjoins a block of doped polysilicon metal silicide.

A semiconductor structure according to the present invention comprises:
a block of undoped polysilicon;
a first block of doped polysilicon adjoining the block of undoped polysilicon at a first boundary;
a block of undoped polysilicon metal silicide adjoining the block of undoped polysilicon; and
a first block of doped polysilicon metal silicide adjoining the first block of doped polysilicon and adjoining the block of undoped polysilicon metal silicide.

Preferably, the first boundary is located on a shallow trench isolation (STI). Semiconductor devices are formed in active area of the semiconductor substrate, that is, an area on the semiconductor substrate that is not covered by the STI. An active area is isolated from another active area by the STI as seen from above. Some of the semiconductor devices, for example, a MOSFET, require a gate dielectric. Preferably, the semiconductor structure according to the present invention also comprises a first gate dielectric that contacts the first doped polysilicon.

The semiconductor structure according to the present invention may further comprise the following:
a second block of doped polysilicon adjoining the block of undoped polysilicon at a second boundary and not adjoining the first block of doped polysilicon; and
a second block of doped polysilicon metal silicide adjoining the second block of doped polysilicon and adjoining the block of undoped polysilicon metal silicide.

Preferably, the second boundary is also located on a shallow trench isolation (STI). Preferably, the semiconductor structure according to the present invention also comprises a second gate dielectric that contacts the second doped polysilicon The first gate dielectric and the second gate dielectric may be located within the same active area or alternatively, the first gate dielectric and the second gate dielectric may be located in different active areas.

Preferably, the block of undoped polysilicon does not contact a gate dielectric, that is, both the first boundary and the second boundary are located on the STI and the block of undoped polysilicon is confined over the STI. In this case, both the first doped polysilicon and the second doped polysilicon may contact the STI.

An aspect of the present invention is a reduction in the defect density in the polysilicon metal silicide wiring. Undoped polysilicon metal silicide is less prone to defects than either P+ doped polysilicon metal silicide or N+ doped polysilicon metal silicide. Therefore, the density of defects in the polysilicon metal silicide decreases by employing a block of undoped polysilicon metal silicide.

Another aspect of the present invention is the enablement of a faster and more cost-effective detection of defects in a polysilicon metal silicide wiring. The defects in a block of P+ doped polysilicon metal silicide or N+ doped polysilicon metal silicide are not easily detected in a low-speed testing since the fractional increase in the resistance of the polysilicon metal silicide wiring containing defective P+ doped polysilicon metal silicide or N+ doped polysilicon is not substantial due to the parallel electrical connection of P+ doped polysilicon material or N+ doped polysilicon material around the defects. The detection of these defects often requires a high-speed functional testing. The defects in a block of undoped polysilicon metal silicide can be easily detected in a low-speed testing since the resistance of the undoped polysilicon material underlying the defects is very high, typically greater than 1 MOhm, and thus, no parallel electrical conduction path exists around the defects. In other words, a defect in the block of undoped polysilicon metal silicide would show up as an electrical "open" even in a low-speed testing. The kind of defects in doped polysilicon metal silicide that degrades circuit performance at the frequency of circuit operation and detectable only by high-speed functional testing according to the prior art are replaced by defects in the block of undoped polysilicon metal silicide that are easily detectable in a low-speed testing by resistance measurements on the structure.

According to the present invention, the density of defects in polysilicon metal silicide wiring that degrade functionality at a high frequency is decreased by the use of undoped polysilicon metal silicide. Furthermore, such defects are more easily detected once they are generated, and in many cases they can be detected in a low-speed testing without using a high-speed functional testing, thus shortening the testing time and expenses.

BRIEF DESCRIPTION OF THE DRAWINGS

FIG. 1A is a top-down view of an exemplary polysilicon metal silicide wiring structure according to the prior art.

FIG. 1B is a vertical cross-sectional view of the exemplary polysilicon metal silicide wiring structure according to the prior art along the plane of B-B' in FIG. 1A.

FIG. 2A is a top-down view of an exemplary polysilicon metal silicide wiring structure according to the present invention.

FIG. 2B is a vertical cross-sectional view of the exemplary polysilicon metal silicide wiring structure according to the present invention along the plane of B-B' in FIG. 2A.

DETAILED DESCRIPTION OF THE INVENTION

Referring to FIGS. 2A and 2B, an exemplary polysilicon metal silicide wiring structure according to the present invention is shown. FIG. 2A is a top-down view and FIG. 2B is a vertical cross-sectional view of along the plane B-B' in FIG. 2A. Two p-type MOSFETs and two n-type MOSFETs are shown on a semiconductor substrate 210. Each of the two p-type MOSFETs comprises P+ doped source and drain regions 261, a gate dielectric 230, a block of P+ doped polysilicon 231, and a block of P+ doped polysilicon metal silicide 241. Each of the two n-type MOSFETs comprises N+ doped source and drain regions 262, a gate dielectric 230, a block of N+ doped polysilicon 232, and a block of N+ doped polysilicon metal silicide 242. Connections between adjacent MOSFETs are formed by extensions of the gate conductor that are substantially a stack of a block of undoped polysilicon 233 and a block of undoped polysilicon metal silicide 243. The blocks of P+ doped polysilicon 231, the blocks of P+ doped polysilicon metal silicide 241, the blocks of N+ doped polysilicon 232, the block of N+ doped polysilicon metal silicide 242, the blocks of undoped polysilicon 233, and the blocks of undoped polysilicon metal silicide 243 collectively form a gate line.

To form the block of P+ doped polysilicon 231 and the block of N+ doped polysilicon 232, an undoped polysilicon layer is deposited over the gate dielectric layer 230 and over a shallow trench isolation 220, lithographically patterned, and etched. Implantation of p-type dopants with a first mask and implantation of n-type dopants with a second mask follow. The first mask allows the p-type dopants into multiple "p-type implant areas" 251 that include a portion of the STI area that surrounds the PFETs, while blocking the p-type dopants outside the p-type implant area 251. Unlike the prior art, however, each active area that contains a PFET has a p-type implant area 251 that does not adjoin a neighboring p-type implant area. In other words, each of the active areas for a PFET surrounded by the STI 220 has a unique p-type implant area 251. Adjacent p-type implant areas do not overlap one another. The second mask allows the n-type dopants into multiple "n-type implant areas" 252 that include the STI area that surrounds the NFETs while blocking the n-type dopants outside the n-type implant area 252. Unlike the prior art, however, each active area that contains an NFET has an n-type implant area 252 that does not adjoin a neighboring n-type implant area. In other words, each of the active areas for an NFET surrounded by the STI 220 has a unique n-type implant area 252. Adjacent n-type implant areas do not overlap one another.

Furthermore, edges of the p-type implant areas 251 do not overlap edges of the n-type implant areas 252. Therefore, if an active area for a PFET is located adjacent to the active area for an NFET, the associated p-type implant area 251 does not overlap the associated n-type implant area 252. In summary, each of the active areas has an associated implant area (251, 252) that does not overlap any other implant area (251, 252) according to the present invention.

The lack of overlap between the multiple implant areas creates an area over the STI 220 that does not receive any ion implantation. The portions of the polysilicon that is located within the area without any ion implantation remains undoped. Thus, by not implanting any dopant ions into at least one portion of the polysilicon, a block of undoped polysilicon 233 is formed according to the present invention. The patterning of the polysilicon may precede or follow the implantation of the dopants. The implantation into and patterning of the deposited polysilicon forms gate lines, which at this point comprises doped polysilicon and undoped polysilicon. Unlike the prior art, deposition of a heavily doped polysilicon of one dopant type followed by an implantation of dopants of the opposite dopant type to reverse the type of doping in a portion of the deposited heavily doped polysilicon may not be used according to the present invention since such a processing sequence does not form an undoped polysilicon, i.e., polysilicon material substantially without dopants.

Typically, spacers (not shown) are formed around the gate lines. A metal layer comprising a silicide forming metal, for example cobalt, tantalum, titanium, nickel, other refractory metal or an alloy thereof, is subsequently deposited and reacted to form silicides. The reacted metal layer forms a metal silicide (not shown) on the P+ doped or N+ doped source and drain regions (261, 262). The reacted metal layer also forms a block of P+ doped polysilicon metal silicide 241 on top of the block of P+ doped polysilicon 231 and a block of N+ doped polysilicon metal silicide 242 on top of the block of N+ doped polysilicon 232 much the same way as in the prior art. According to the present invention, however, a block of undoped polysilicon 233 is present in the gate lines as shown in FIGS. 2A and 2B. The portion of the portion layer on the block of undoped polysilicon 233 reacts with the underlying undoped polysilicon 233 to form a block of undoped polysilicon metal silicide 243. As noted before, the properties of an undoped polysilicon metal silicide 243 is superior in terms of its reduced susceptibility to defect generation to the properties of the P+ doped polysilicon metal silicide or to the properties of the N+ doped polysilicon metal silicide.

The overlap between the block of P+ doped polysilicon 231 with the STI 220 is preferably less than 40 nm, and more preferably less than 20 nm, and most preferably less than 10 nm. Similarly, the overlap between the block of N+ doped polysilicon 232 with the STI 220 is preferably less than 40 nm, and more preferably less than 20 nm, and most preferably less than 10 nm. Since the edges of the block of P+ doped polysilicon 231 coincides with the edges of the block of P+ doped polysilicon metal silicide 241, the overlap between the block of P+ doped polysilicon metal silicide 241 with the STI 220 is preferably less than 40 nm, and more preferably less than 20 nm, and most preferably less than 10 nm. Also, the edges of the block of N+ doped polysilicon 232 coincides with the edges of the block of N+ doped polysilicon metal silicide 242, and consequently, the overlap between the block of N+ doped polysilicon metal silicide 242 with the STI 220 is preferably less than 40 nm, and more preferably less than 20 nm, and most preferably less than 10 nm.

In the exemplary polysilicon metal silicide wiring structure according to the present invention in FIGS. 2A and 2B, each of the active area for a PFET comprises a stack of a block of P+ doped polysilicon 231 and a block of P+ doped polysilicon metal silicide 241 over a gate dielectric 230. Similarly, each of the active area for an NFET comprises a stack of a block of N+ doped polysilicon 232 and a block of N+ doped polysilicon metal silicide over a gate dielectric 230. In addition, between each active area, a stack of a block of undoped polysilicon 233 and a block of undoped polysilicon metal silicide 243 is located on the underlying STI.

Therefore, on one side of each of the stacks of the block of undoped polysilicon 233 and the block of undoped polysilicon metal silicide 243 is a stack of a first block of doped polysilicon (231 or 232) and a first block of doped polysilicon metal silicide (241 or 242). The first doped polysilicon adjoins the block of undoped polysilicon at a boundary 290 and the first doped polysilicon metal silicide (241 or 242) adjoins the block of undoped polysilicon metal silicide 243. Preferably, the boundary 290 is located on the STI to avoid adverse effects on the MOSFET formed on the active area. This is because a decrease or a lack of dopants in the gate polysilicon over the active area degrades the performance of the MOSFET by a high resistance of the gate material and by high depletion of free carriers in the gate material nearby the channel. In a typical MOSFET structure, a gate dielectric directly contacts the block of doped polysilicon (232 or 232).

On the opposite side of the stack of the block of undoped polysilicon 233 and the block of undoped polysilicon metal silicide 243, a similar stack of a second block of doped polysilicon (231 or 232) and a second doped polysilicon metal silicide (241 or 242) contacts the stack of the block of undoped polysilicon 233 and the block of undoped polysilicon metal silicide 243. The second block of doped polysilicon (231 or 232) adjoins the block of undoped polysilicon 233 at another boundary 290 and the second doped polysilicon metal silicide (241 or 242) adjoins the block of undoped polysilicon metal silicide 243. Preferably, the boundary 290 is located on the STI to avoid adverse effects on the MOSFET formed on that active area.

All combinations of dopant types are possible for the first doped polysilicon (231 or 232) and for the second doped polysilicon (231 or 232). In a first case, the first doped polysilicon may be P+ doped and the second doped polysilicon may be P+ doped. In a second case, the first doped polysilicon may be P+ doped and the second doped polysilicon may be N+ doped. In a third case, the first doped polysilicon may be N+ doped and the second doped polysilicon may be P+ doped. In a fourth case, the first doped polysilicon may be N+ doped and the second doped polysilicon may be N+ doped.

In contrast to the prior art in which a block of doped polysilicon adjoins another block of doped polysilicon of the opposite doping, a block of doped polysilicon adjoins a block of undoped polysilicon according to the present invention. Similarly, in contrast to the prior art in which a block of doped polysilicon metal silicide formed out of a reaction of a metal with a doped polysilicon of one doping type adjoins another block of doped polysilicon metal silicide formed out of a reaction of the metal with another doped polysilicon of the opposite doping type, a block of doped polysilicon metal silicide adjoins a block of undoped polysilicon metal silicide according to the present invention.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure, comprising:
   a substrate including a shallow trench isolation (STI) structure;
   a first gate dielectric located on a semiconductor portion of said substrate;
   a block of undoped polysilicon located directly on a top surface of said shallow trench isolation (STI) structure;
   a first block of doped polysilicon located directly on said first gate dielectric and in direct contact with said block of undoped polysilicon at a first boundary;
   a block of undoped polysilicon metal silicide located directly on a top surface of said block of undoped polysilicon; and
   a first block of doped polysilicon metal silicide located directly on a top surface of said first block of doped polysilicon and located directly on an edge of said block of undoped polysilicon metal silicide, wherein said edge of said block of undoped polysilicon metal silicide vertically coincides with said first boundary.

2. The semiconductor structure of claim 1, wherein said first boundary is located directly on said shallow trench isolation (STI) structure.

3. The semiconductor structure of claim 1, further comprising:
   a second block of doped polysilicon in direct contact with said block of undoped polysilicon at a second boundary and not in direct contact with said first block of doped polysilicon; and
   a second block of doped polysilicon metal silicide in direct contact with said second block of doped polysilicon and in direct contact with said block of undoped polysilicon metal silicide.

4. The semiconductor structure of claim 3, wherein said second boundary is located directly on said shallow trench isolation (STI) structure.

5. The semiconductor structure of claim 4, further comprising a second gate dielectric that directly contacts said second block of doped polysilicon.

6. The semiconductor structure of claim 5, wherein said block of undoped polysilicon does not directly contact a gate dielectric.

7. The semiconductor structure of claim 6, wherein said first block of doped polysilicon is P+ doped and said second block of doped polysilicon is P+ doped.

8. The semiconductor structure of claim 6, wherein said first block of doped polysilicon is P+ doped and said second block of doped polysilicon is N+ doped.

9. The semiconductor structure of claim 6, wherein said first block of doped polysilicon is N+ doped and said second block of doped polysilicon is P+ doped.

10. The semiconductor structure of claim 6, wherein said first block of doped polysilicon is N+ doped and said second block of doped polysilicon is N+ doped.

11. The semiconductor structure of claim 6, wherein said first block of doped polysilicon directly contacts said STI and said second block of doped polysilicon directly contacts said STI.

12. The semiconductor structure of claim 4, wherein a first overlap between said first block of doped polysilicon with said STI is less than 40 nm and a second overlap between second block of doped polysilicon with said STI is less than 40 nm.

13. The semiconductor structure of claim 12, wherein a first overlap between said first block of doped polysilicon with said STI is less than 20 nm and a second overlap between said second block of doped polysilicon with said STI is less than 20 nm.

14. The semiconductor structure of claim 12, wherein a first overlap between said first block of doped polysilicon with said STI is less than 10 nm and a second overlap between said second block of doped polysilicon with said STI is less than 10 nm.

15. The semiconductor structure of claim 1, wherein said block of undoped polysilicon and said first block of doped polysilicon have a same constant thickness.

16. The semiconductor structure of claim 3, wherein said block of undoped polysilicon, said first block of doped polysilicon, and said second block of doped polysilicon have a same constant thickness.

17. A semiconductor structure, comprising:
a substrate including a shallow trench isolation (STI) structure;
a first gate dielectric located on a semiconductor portion of said substrate;
a block of undoped polysilicon located directly on a top surface of said shallow trench isolation (STI) structure, wherein said block of undoped polysilicon does not directly contact a gate dielectric;
a first block of doped polysilicon located directly on said first gate dielectric and in direct contact with said block of undoped polysilicon at a first boundary, wherein said first boundary is located directly on said shallow trench isolation (STI) structure;
a block of undoped polysilicon metal silicide located directly on a top surface of said block of undoped polysilicon;
a first block of doped polysilicon metal silicide located directly on a top surface of said first block of doped polysilicon and located directly on an edge of said block of undoped polysilicon metal silicide, wherein said edge of said block of undoped polysilicon metal silicide coincides with said first boundary, and wherein said first block of doped polysilicon directly contacts said STI;
a second block of doped polysilicon located directly on a second gate dielectric and in direct contact with said block of undoped polysilicon at a second boundary and not in direct contact with said first block of doped polysilicon, wherein said second boundary is located directly on said shallow trench isolation (STI) structure, wherein said second block of doped polysilicon directly contacts said STI, wherein said block of undoped polysilicon, said first block of doped polysilicon, and said second block of doped polysilicon have a same constant thickness; and
a second block of doped polysilicon metal silicide in direct contact with said second block of doped polysilicon and in direct contact with said block of undoped polysilicon metal silicide.

18. A semiconductor structure, comprising:
a block of undoped polysilicon located directly on a top surface of a shallow trench isolation (STI) structure, wherein said block of undoped polysilicon does not directly contact a gate dielectric;
a first block of doped polysilicon located directly on a first gate dielectric and in direct contact with said block of undoped polysilicon at a first boundary, wherein said first boundary is located directly on said shallow trench isolation (STI) structure;
a block of undoped polysilicon metal silicide located directly on a top surface of said block of undoped polysilicon;
a first block of doped polysilicon metal silicide located directly on a top surface of said first block of doped polysilicon and located directly on an edge of said block of undoped polysilicon metal silicide, and wherein said first block of doped polysilicon directly contacts said STI;
a second block of doped polysilicon located directly on a second gate dielectric and in direct contact with said block of undoped polysilicon at a second boundary and not in direct contact with said first block of doped polysilicon, wherein said second boundary is located directly on said shallow trench isolation (STI) structure, wherein said second block of doped polysilicon directly contacts said STI; and
a second block of doped polysilicon metal silicide in direct contact with said second block of doped polysilicon and in direct contact with said block of undoped polysilicon metal silicide.

* * * * *